(12) United States Patent
Linkewitsch

(10) Patent No.: US 7,415,658 B2
(45) Date of Patent: Aug. 19, 2008

(54) FORWARD ERROR CORRECTION MAPPING AND DE-MAPPING TECHNIQUES

(75) Inventor: Niklas Linkewitsch, Evessen (DE)

(73) Assignee: Intel Corporation, Santa Clara, CA (US)

( * ) Notice: Subject to any disclaimer, the term of this patent is extended or adjusted under 35 U.S.C. 154(b) by 1192 days.

(21) Appl. No.: 10/660,404

(22) Filed: Sep. 10, 2003

(65) Prior Publication Data

US 2005/0053285 A1  Mar. 10, 2005

(51) Int. Cl.
*H03M 13/00* (2006.01)
(52) U.S. Cl. ................................. 714/779; 714/801
(58) Field of Classification Search .............. 714/779, 714/801
See application file for complete search history.

(56) References Cited

U.S. PATENT DOCUMENTS

| 4,329,708 | A | | 5/1982 | Yamamoto et al. |
| 4,564,945 | A | | 1/1986 | Glover et al. |
| 5,230,003 | A | | 7/1993 | Dent et al. |
| 5,392,299 | A | | 2/1995 | Rhines et al. |
| 5,754,563 | A | | 5/1998 | White |
| 5,812,601 | A | | 9/1998 | Schramm |
| 5,970,085 | A | * | 10/1999 | Yi ............................... 370/342 |
| 5,978,365 | A | * | 11/1999 | Yi ............................... 370/331 |
| 6,029,264 | A | | 2/2000 | Kobayashi et al. |
| 6,094,427 | A | * | 7/2000 | Yi ............................... 370/331 |
| 6,161,209 | A | | 12/2000 | Moher |
| 6,189,123 | B1 | | 2/2001 | Nystrom et al. |
| 6,304,996 | B1 | * | 10/2001 | Van Stralen et al. ......... 714/796 |
| 6,389,572 | B1 | * | 5/2002 | Garrabrant et al. .......... 714/780 |
| 6,421,804 | B1 | | 7/2002 | Lee |
| 6,581,178 | B1 | | 6/2003 | Kondo |
| 6,622,277 | B1 | | 9/2003 | Ramanujam et al. |
| 2002/0161972 | A1 | | 10/2002 | Talagala et al. |
| 2003/0135514 | A1 | | 7/2003 | Patel et al. |
| 2003/0188248 | A1 | | 10/2003 | Kauschke et al. |
| 2003/0188253 | A1 | | 10/2003 | Kauschke et al. |
| 2004/0177153 | A1 | * | 9/2004 | Pelley .......................... 709/236 |
| 2004/0240485 | A1 | * | 12/2004 | Lipski et al. ................ 370/537 |

FOREIGN PATENT DOCUMENTS

| EP | 0 663 776 A2 | 7/1995 |
| EP | 0 663 776 A3 | 7/1995 |
| EP | 1 162 775 A2 | 12/2001 |
| WO | 01/95503 A1 | 12/2001 |
| WO | WO 01/95503 A1 | 12/2001 |

OTHER PUBLICATIONS

European Patent Office, International Search Report and Written Opinion for International Application No. PCT/US2004/027681, 12 pages, Jun. 16, 2005.

Ait Sab, O. et al, "Block Turbo Code Performances for Long-Haul DWDM Optical Transmission Systems", Optical Fiber Communication Conference (OFC), Technical Digest Postconference Edition, vol. 3 of 4, pp. 280-282, published by IEEE, New York, NY, Mar. 2000.

(Continued)

*Primary Examiner*—Mujtaba K Chaudry
(74) *Attorney, Agent, or Firm*—Caven & Aghevli LLC

(57) ABSTRACT

Briefly, techniques to provide varying levels of enhanced forward error correction without modifying a line rate of a frame.

42 Claims, 7 Drawing Sheets

OTHER PUBLICATIONS

Ait Sab, O. et al, "Concentrated Forward Error Correction Schemes for Long-Haul DWDM Optical Transmission Systems", 25th European Conference on Optical Communication (ECOC '99), Regular and Invited Papers, vol. II of II, pp. 290-291, Paris, France, Sep. 1999.

Agere Systems Inc., "TFEC0410G 40 Gbits/s Optical Networking Interface with Strong FEC and Digital Wrapper", 18 pages, Allentown, PA, Mar. 2001.

S. Keshav, "An Engineering Approach to Computer Networking: ATM Networks, the Internet, and the Telephone Network", Chapter 12: Error Control, pp. 390-391, Addison Wesley Publishing Company, Reading, MA, Apr. 1997.

International Telecommunication Union, Telecommunication Standardization Sector (ITU-T), "Series G: Transmission Systems and Media, Digital Systems and Networks; Digital Terminal Equipments—General; Interface for the Optical Transport Network (OTN)", Document No. G.709 (revised), 133 pages, Oct. 2001.

PCT Written Opinion, dated Mar. 23, 2005, International Application No. PCT/US03/09621, 6 pages.

Pyndiah, R, et al., "Near Optimum Decoding of Product Codes", IN Proceedings of IEEE GLOBECOM '94, vol. 1/3, pp. 339-343, Nov.-Dec. 1994.

Stephen B. Wicker, "Error Control Systems for Digital Communication and Storage", Prentice-Hall, 1995, pp. 116-121.

Stojanovic, N. et al., "Concatenated Three-Dimensional SPC Turbo Code Transmission Systems", 5th International Conference on Telecommunications in Modern Satellite, Cable and Broadcasting Service, 2001, vol. 2, Sep. 19-21.

Agere Systems, "TFEC0410G 40 Gbits/s Optical Networking Interface With Strong FEC and Digital Wrapper", 18 pages, Mar. 2001.

Keshav S., "An Engineering Approach to Computer Networking ATM Networks, the Internet, and the Telephone Network", Chapter 12: Error Control, pp. 390-391, Apr. 1997, Addison-Wesley Professional Computing Series.

Omar Ait Sab et al., "Block Turbo Code Performances For Long-Haul DWDM Optical Transmission Systems", IEEE vol. 3 of 4 pp. 280-282. XP002181576.

O. Ait Sab et al., "Concatenated Forward Error Correction Schemes for Long-Haul DWDM Optical Transmission Systems", ECOC '99, Paris, France, vol. II of II, pp. 290-291. XP001035445.

Mizuochi, et al., "Transparent Multiplexer Featuring Super FEC for Optical Transport Networking", Mitsubishi Electric Corp., Japan, 4 pages.

Argon, et al., "Turbo Product Codes for Performance Improvement of Optical CDMA Systems", Georgia Institute of Technology, Atlanta, GA USA 2001, 5 pages.

Young Kim et al., "An Optical CDMA Packet Network with Turbo Coding", Central Research & Development Center, Korea 2000, 5 pages.

PCC et al., "Concatenated FEC Experiment over 5000 KM Long Straight Line WDM Test Bed", Tyco Submarine Systems Laboratories, Holmdel, NJ, USA, XP-000967046, 4 pages.

Kao et al., "A Product-Coded WDM Coding System", Transactions on Communications, New York, USA, Jan. 1996, 4 pages.

Ait Sab, "FEC Techniques in Submarine Transmission Systems", Optical Society of America. 1999, 3 pages.

Berrous, Claude, "Near Optimum Error Correcting Coding And Decoding: Turbo-Codes", IEEE Transactions on Communications, vol. 44, No. 10, Oct. 1996, pp. 1261-1271.

* cited by examiner

FORWARD ERROR CORRECTION MAPPING AND DE-MAPPING TECHNIQUES

CROSS REFERENCE TO RELATED PATENT APPLICATION

The present application is related to U.S. patent application Ser. No. 10/113,190, filed Apr. 1, 2002, inventors Poppinga and Kauschke.

FIELD

The subject matter disclosed herein generally relates to forward error correction mapping techniques.

DESCRIPTION OF RELATED ART

ITU-T G.709/Y.1331 Interfaces for the Optical Transport Network (OTN) (February 2001) describes a convention for conversion of signals between the optical transport network (OTN) standard and either Synchronous Optical Network (SONET) or Synchronous Digital Hierarchy (SDH) standards. G.709 describes forward error correction (FEC) as a manner of controlling errors in transmitted data. FEC information is transmitted with data and can be used by the receiver to check and correct the data. G.709 describes Reed-Solomon coder/decoder techniques for determining and mapping FEC information into designated locations within an OTN frame as well as techniques for processing and de-mapping FEC information.

BRIEF DESCRIPTION OF THE DRAWINGS

The subject matter regarded as the invention is particularly pointed out and distinctly claimed in the concluding portion of the specification. The invention, however, both as to organization and method of operation may best be understood by reference to the following detailed description when read with the accompanying drawings in which:

Note that use of the same reference numbers in different figures indicates the same or like elements.

DETAILED DESCRIPTION

Figure 1A:
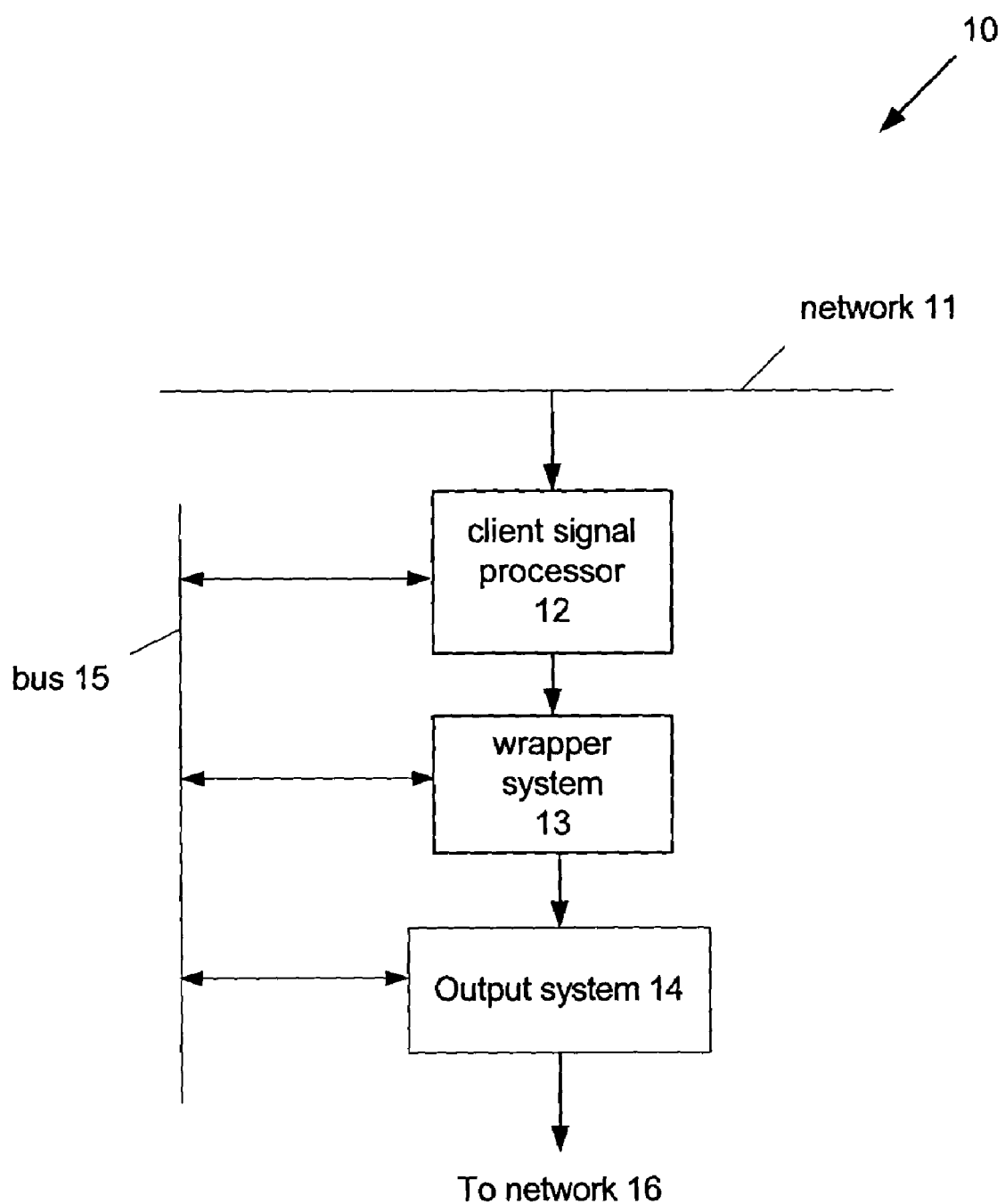
FIG. 1A depicts an implementation of a transmitter system that can use embodiments of the present invention.

FIG. 1A depicts an implementation of a transmitter system 10 that can use embodiments of the present invention. System 10 may include a network 11, client signal processor 12, wrapper system 13, output system 14, and bus 15.

Network 11 may provide intercommunication between processor 12 and other devices such as a packet processor (not depicted), and/or a switch fabric (not depicted). Network 11 may comply with one or more of the following standards: Ten Gigabit Attachment Unit Interface (XAUI) (described in IEEE 802.3, IEEE 802.3ae, and related standards), (Serial Peripheral Interface (SPI), I²C, universal serial bus (USB), IEEE 1394, Gigabit Media Independent Interface (GMII) (described in IEEE 802.3, IEEE 802.3ae, and related standards), Peripheral Component Interconnect (PCI), ten bit interface (TBI), and/or a vendor specific multi-source agreement (MSA) protocol. Bus 15 may provide intercommunication between client signal processor 12, and/or wrapper system 13, and/or output system 14 and other devices such as memory device (not depicted), or microprocessor (not depicted).

Processor 12 may perform media access control (MAC) encoding in compliance for example with Ethernet (as described for example in IEEE 802.3 and related standards). Wrapper system 13 may perform framing and wrapping in compliance for example with ITU-T G.709; and/or forward error correction (FEC) encoding in compliance for example with ITU-T G.975. Wrapper system 13 may use some embodiments of the present invention. Output system 14 may remove jitter from signals provided by wrapper system 13 and prepare signals for transmission to a network 16, which may be optical or electrical format. For example, network 16 may comply with OTN.

In one implementation, components of transmitter system 10 may be implemented among the same integrated circuit. In another implementation, components of transmitter system 10 may be implemented among several integrated circuits that intercommunicate using, for example, a bus or conductive leads of a printed circuit board.

Figure 1B:
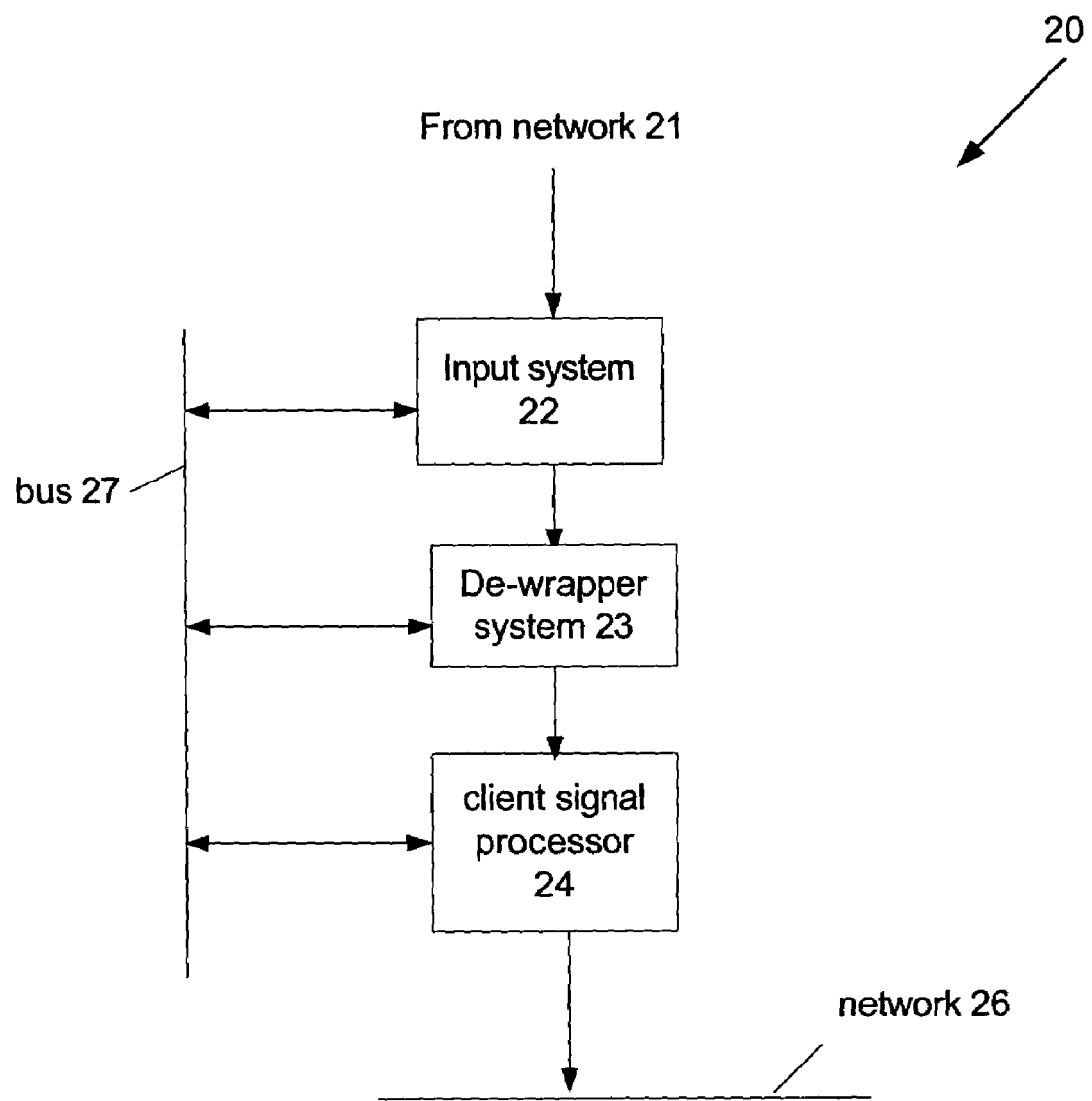
FIG. 1B depicts an implementation of a receiver system that can use embodiments of the present invention.
Figure 2A:
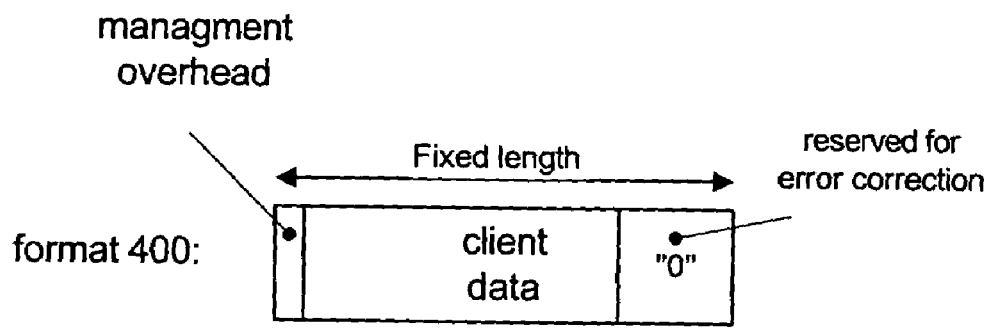
FIGS. 2A to 2E depict frames of varying formats in accordance with an embodiment of the present invention.
Figure 2B:
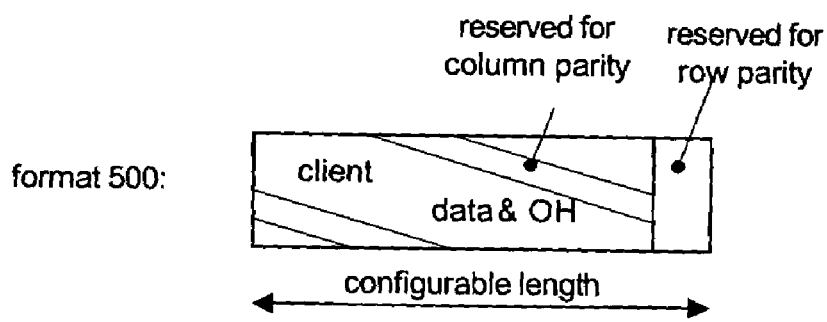
Figure 2C:
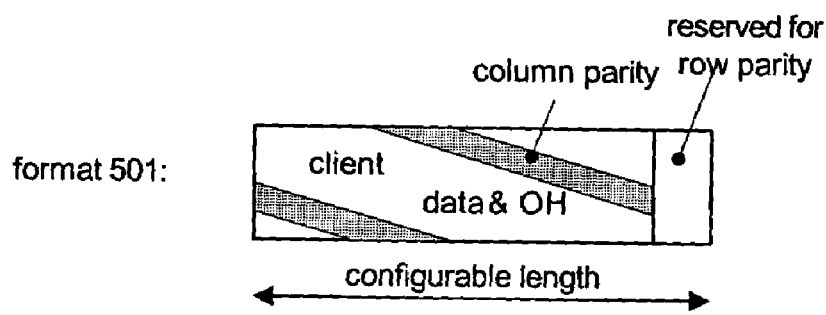
Figure 2D:
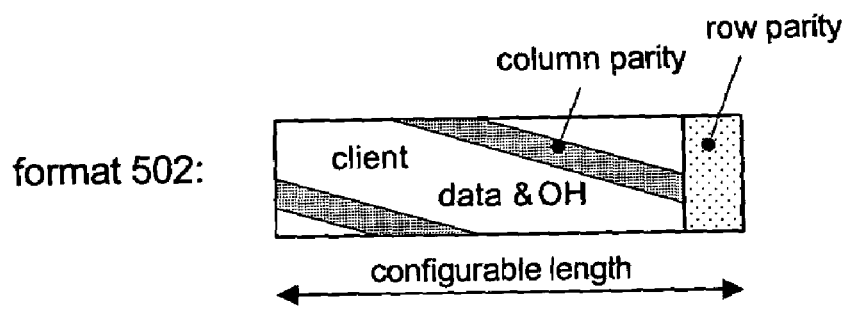
Figure 2E:
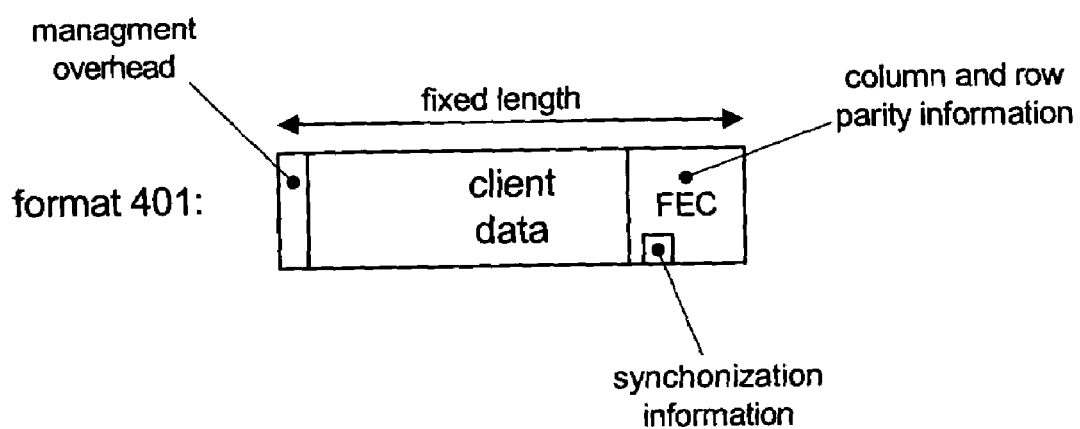

FIG. 1B depicts an implementation of a receiver system 20 that can use embodiments of the present invention. System 20 may include an input system 22, de-wrapper system 23, client signal processor 24, network 26, and bus 27. Input system 22 may receive a signal from a network 21 and prepare the signal for processing by receiver system 20. For example, input system 22 may convert an optical signal to electrical format and/or remove jitter from a signal from the network. De-wrapper system 23 may perform optical transport network (OTN) de-framing and de-wrapping in compliance for example with ITU-T G.709; and/or forward error correction (FEC) processing in compliance for example with ITU-T G.975. De-wrapper system 23 may use some embodiments of the present invention. Processor 24 may perform media access control (MAC) processing in compliance for example with Ethernet.

Network 26 may provide intercommunication between processor 24 and other devices such as a packet processor (not depicted), a switch fabric (not depicted), and/or an optical network (not depicted). Network 26 may utilize similar communications techniques as those of network 11. Bus 27 may provide intercommunication between input system 22 and/or de-wrapper 23 and/or processor 24 and other devices such as a memory device (not depicted) or microprocessor (not depicted).

In one implementation, components of receiver system 20 may be implemented among the same integrated circuit. In another implementation, components of receiver system 20 may be implemented among several integrated circuits that intercommunicate using, for example, a bus or conductive leads of a printed circuit board.

FIGS. 2A to 2E depict frames of respective formats 400, 500, 501, 502, and 401. Frame format 400 may comply with the G.709 OTU2 frame format, although other formats may be used. Frame format 400 may include management overhead, client data, and error correction portions. Frame format 400 may have fixed length and a fixed number of rows. In one example, the client data portion may include data in accordance with the SONET or OTN standards.

Frame format 500 may include a first portion that includes a mixture of client data (from frame format 400), G.709 overhead information (from frame format 400), and reserved space for column parity information as well as a second portion reserved for row parity information. The reserved space for column parity information may be diagonally provided within the first portion. Frame format 500 may be configurable in the following parameters: number of columns, number of rows, the angle and thickness of the column parity information provided within the first portion, and size of row parity information. The parameters may be set to maintain the percentage of bits reserved for client data (from frame format 400) and G.709 overhead information (from frame format 400) among frame format 400 as the same percentage as that in frame format 500.

Figure 4A:
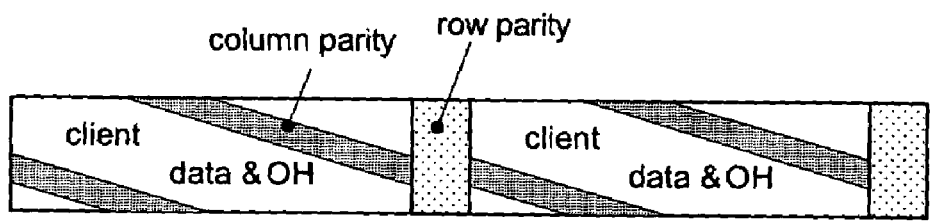
FIGS. 4A and 4B depict example frame streamings.
Figure 4B:
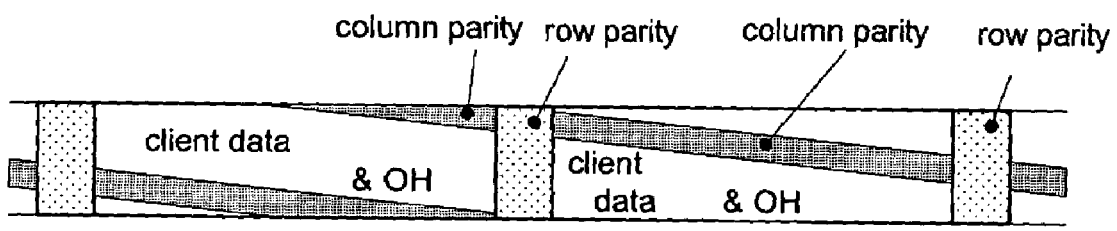

In one implementation, depicted in FIG. 4A, frames of format 500 might stream in a concatenation style as continuous series of separate frames. In this concatenation style, there might be no time gap between two successive frames of format 500. Format 500 may also be processed using an interleaving style such as one described in U.S. patent application Ser. No. 10/113,190, filed Apr. 1, 2002, inventors Poppinga and Kauschke. As depicted in FIG. 4B, the interleaving style may include streaming frames of format 500 as a continuous series of separate frames except column parity information of a single frame of format 500 is spread over multiple frames of format 500. Herein, references to "format 500" or "frame format 500" may refer to streaming in either the concatenation or interleaving styles.

Frame format 501 may be a similar structure as frame format 500 but with column parity information inserted in the reserved space for column parity information. Frame format 502 may be a similar structure as frame format 501 but with row parity information inserted in the reserved space for row parity information. Similar to format 500, formats 501 and 502 may stream by concatenation or interleaving styles.

Frame format 401 may be similar to frame format 400 except at least that the error correction portion may include column and row parity information and synchronization information. For example, column and row parity information may be stored in a similar order as that stored in a frame of format 502. Synchronization information may indicate locations of column and row parity information within frame format 502. Synchronization information may be stored within a predefined location within the error correction portion of frame format 401. In one implementation, synchronization information could be defined in each frame of format 401, but could also appear in every N frames of format 401, where N is an integer greater than one. Alternatively, the synchronization information may be partitioned in a way that every frame one fraction of the synchronization information will be transmitted so that it may take an integer N number of frames of format 401 (where N is greater than one) to transmit the entire synchronization information of a single frame of format 401. Management overhead and client data may be mapped into locations in frame 401 that are similar to those locations in frame 400.

Figure 3:
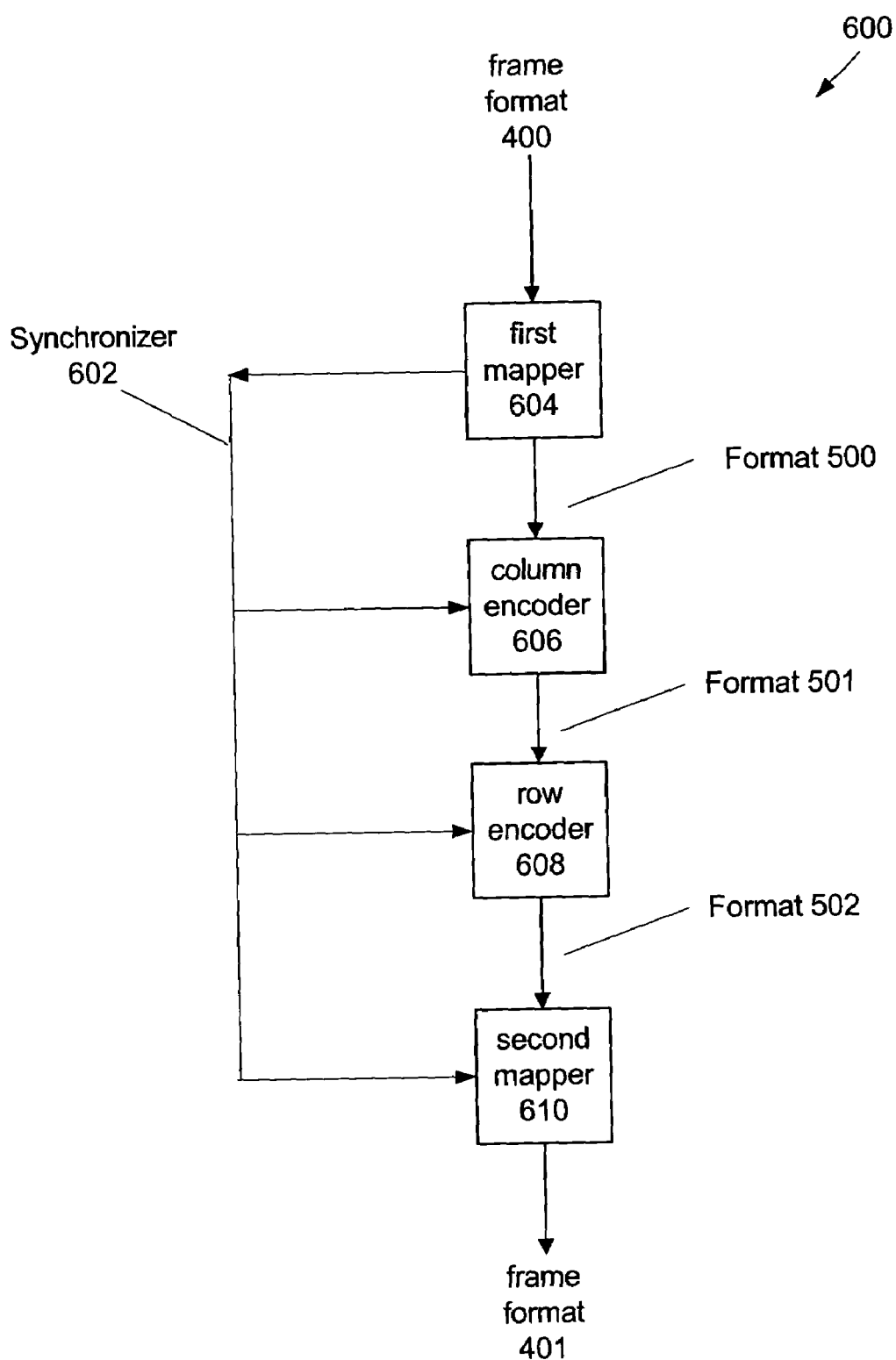
FIG. 3 depicts an encoder, in accordance with an embodiment of the present invention.

FIG. 3 depicts an embodiment of the present invention in an encoder 600, in accordance with an embodiment of the present invention. One implementation of encoder 600 may include synchronizer 602, first mapper 604, column encoder 606, row encoder 608, and second mapper 610. Reference is made to frames having formats 400, 500, 501, 502, and 401 depicted in respective FIGS. 2A to 2E.

Encoder 600 may be implemented as any or a combination of: hardwired logic, software stored by a memory device and executed by a microprocessor, firmware, an application specific integrated circuit (ASIC), and/or a field programmable gate array (FPGA).

Synchronizer 602 may track the bit locations of column and row parity information within a frame of format 500. Synchronizer 602 may provide the bit locations of column and row parity information to column encoder 606, row encoder 608, and second mapper 610. Synchronizer 602 may store synchronization information within a frame of format 401. The synchronization information may represent the timing and phase locations of column and row parity information within a frame of format 500.

First mapper 604 may convert a frame from format 400 to format 500. First mapper 604 may reserve space for column parity information as well as space for row parity information. In the locations inside format 500 depicted as "client data & OH", first mapper 604 may insert client data and management overhead. First mapper 604 may initialize the bits reserved for column and row parity information to zeros. In one implementation, encoder 600 may vary parameters of a frame of format 500 based on the desired level of FEC protection.

Column encoder 606 may insert column parity information into space reserved for column parity information in a frame of format 500. Row encoder 608 may insert row parity information into space reserved for row parity information in a frame of format 500. For example, Bose, Chaudhuri and Hocquenghem (BCH) or Reed Solomon (RS) encoding techniques may be used to determine column and row parity information stored in frame format 500. Calculation of column and row parity information may be based on processing client data. Calculation of column and row parity information may also be based on parameters such as overhead values and parameters of frame format 502 that include, but are not limited to, a number of columns, number of rows, the angle and thickness of the column parity information, and size of row parity information.

Second mapper 610 may convert a frame from format 502 to format 401. Second mapper 610 may map the client data and management overhead into locations inside the frame of format 401 that are similar to those of format 400 and may map column and row parity information as well as synchronization information into the error correction portion of a frame of format 401. A frame of format 401 may be transmitted to a network such as an optical network or electrical network.

Encoder 600 may provide stronger FEC encoding protection than that specified in G.709. Accordingly, by use of encoder 600, signals can be transmitted over systems that introduce higher bit errors. Encoder 600 may provide stronger FEC protection than that specified in G.709 without changing a line rate of management overhead and client data or the transmitted frame structure.

Figure 5:
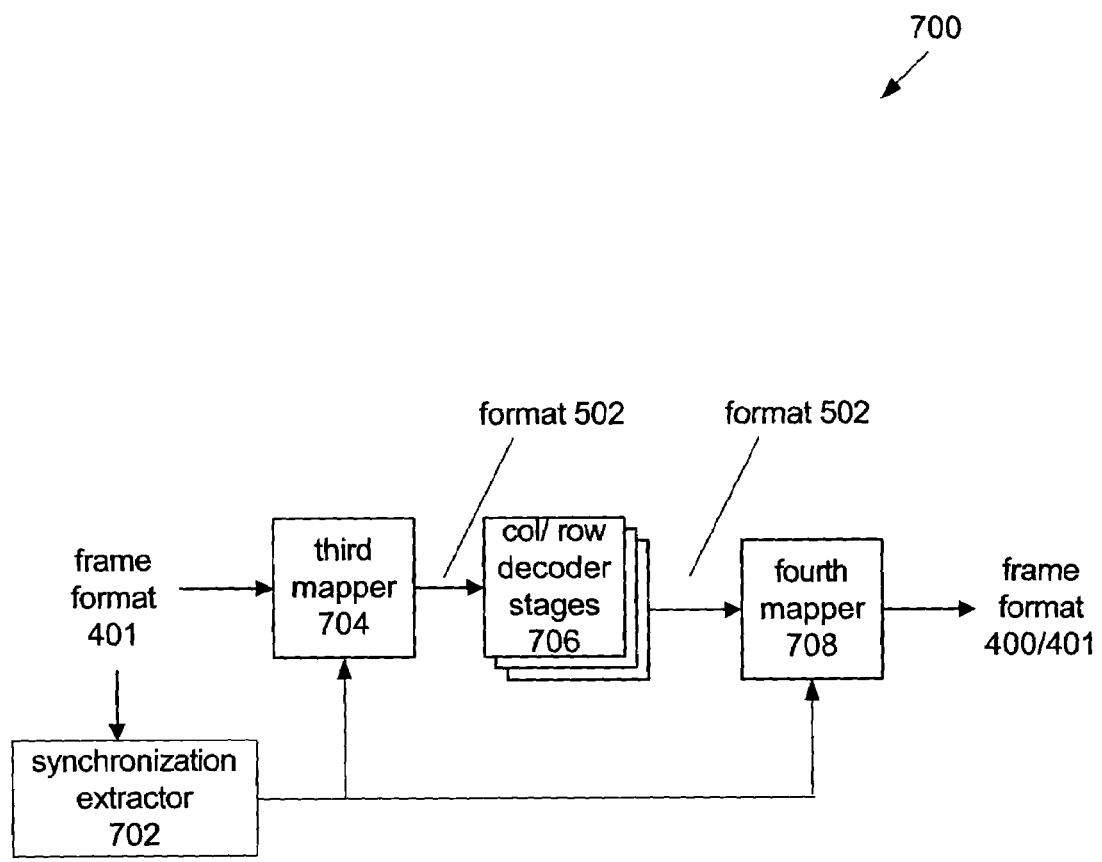
FIG. 5 depicts an embodiment of a decoder, in accordance with an embodiment of the present invention.

FIG. 5 depicts an embodiment of the present invention in decoder 700, in accordance with an embodiment of the present invention. One implementation of decoder 700 may include synchronization information extractor 702, third mapper 704, column and row decoder stages 706, and fourth mapper 708. Reference is made to frames having formats 400, 500, 501, 502, and 401 depicted in respective FIGS. 2A to 2E. For example, decoder 700 may process a frame of format 401 transmitted through a network and from a transmitter using an encoder similar to encoder 600.

Decoder 700 may be implemented as any or a combination of: hardwired logic, software stored by a memory device and executed by a microprocessor, firmware, an application specific integrated circuit (ASIC), and/or a field programmable gate array (FPGA).

Synchronization information extractor 702 may extract synchronization information from a frame of format 401.

Synchronization information extractor 702 may provide the locations of column and row parity information in a frame of format 502.

Third mapper 704 may convert a frame from format 401 to format 502. For example, third mapper 704 may read the column and row parity information that is stored in an error correction portion of a frame of format 401. For example, third mapper 704 may store the column and row parity information in locations in a frame of format 502 indicated by the synchronization information.

Column and row decoder stages 706 may decode column and row bit information stored in a frame of format 502. For example in one implementation, column and row decoder stages 706 may utilize BCH or RS techniques to process the column and row bit information and determine whether such processed column and row bit information are correct. Based on the processed column and row bit information, column and row decoder stages 706 may perform error detection and/or correction of management overhead, client data and parity information. Column and row decoder stages 706 may also calculate error statistics in the frames of format 500. For example, error statistics may relate to the percentage of the bandwidth utilized by a frame of format 500. For example, error statistics may relate to management overhead and client data.

In one implementation, column and row decoder stages 706 may perform iterative decoding by alternating processing of rows and columns and performing at least two row or column processings. For example, column and row decoder stages 706 may alternate processing of all rows of a frame of format 502, all columns of a frame of format 502, and (again) all rows of a frame of format 502 or processing of all columns, all rows, and (again) all columns. In one implementation, column and row decoder stages 706 may perform bit processing in the following manner: all rows of a frame of format 502, all columns of a frame of format 502, (again) all rows, (again) all columns, and (again) all rows. In one implementation, column and row decoder stages 706 may perform concatenated decoding by bit processing all rows and all columns once each.

Fourth mapper 708 may convert a frame from format 502 to format 400 or format 401. Fourth mapper 708 may map the client data and management overhead into its original locations inside the frame of format 400 or 401. Fourth mapper 708 may use techniques similar to those described with respect to second mapper 610 to convert a frame of format 502 to format 401.

MODIFICATIONS

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. An apparatus comprising:
    a first mapper to convert a first frame into a second frame, wherein the first frame includes an overhead portion and data portion and wherein the second frame comprises a programmable size and wherein the second frame includes column and row parity information and the overhead portion and the data portion;
    a synchronizer to specify locations of column and row parity information within the second frame, wherein a synchronization information represents the column and row parity information locations;
    an encoder to insert column and row parity information into the second frame; and
    a second mapper to convert the second frame into a third frame, wherein the third frame includes the overhead portion, the data portion, the column and row parity information, and the synchronization information.

2. The apparatus of claim 1, wherein a percentage of the overhead portion and the data portion within the second frame is equal to the percentage of the overhead portion and the data portion within the first frame.

3. The apparatus of claim 1, wherein the second frame comprises a configurable length and width.

4. The apparatus of claim 1, wherein the column and row parity information locations within the second frame are programmable.

5. The apparatus of claim 1, wherein the first mapper to convert the first frame into the second frame is to perform Bose, Chaudhuri and Hocquenghem encoding to determine the column and row parity information.

6. The apparatus of claim 1, wherein the first mapper to convert the first frame into the second frame is to perform Reed Solomon encoding to determine the column and row parity information.

7. The apparatus of claim 1, wherein the third frame comprises an error correction portion to store the synchronization information.

8. The apparatus of claim 1, wherein the third frame is the same size as that of the first frame.

9. The apparatus of claim 1, wherein the programmable size is based on a level of forward error correction encoding.

10. The apparatus of claim 1, wherein the second mapper is to specify locations of the synchronization information within the third frame.

11. The apparatus of claim 1, wherein a concatenation style of the second frame is either stream or block oriented.

12. An apparatus comprising:
    a synchronizer to determine locations of column and row parity information within a first frame;
    a first mapper to convert the first frame into a second frame, wherein the first frame includes an overhead portion, data portion, and a synchronization information and wherein the second frame comprises a programmable size and includes column and row parity information and further includes the overhead portion and the data portion;
    a decoder to perform forward error correction on the second frame; and
    a second mapper to convert the second frame into a third frame, wherein the third frame includes the overhead portion and the data portion.

13. The apparatus of claim 12, wherein the first mapper is to store column and row parity information within the second frame based on the synchronization information.

14. The apparatus of claim 12, wherein the decoder to perform forward error correction is to perform iterative forward error correction.

15. The apparatus of claim 12, wherein the decoder to perform forward error correction is to perform concatenated forward error correction.

16. The apparatus of claim 12, wherein the decoder to perform forward error correction is to perform Bose, Chaudhuri and Hocquenghem processing.

17. The apparatus of claim 12, wherein the decoder to perform forward error correction is to perform Reed Solomon processing.

18. The apparatus of claim 12, wherein the third frame further includes an error correction portion to store the synchronization information.

19. The apparatus of claim 18, wherein the error correction portion includes column and row parity information.

20. The apparatus of claim 12, wherein the third frame is the same size as that of the first frame.

21. A system comprising:
a data processor comprising:
a first mapper to convert a first frame into a second frame, wherein the first frame includes an overhead portion and data portion and wherein the second frame comprises a programmable size and wherein the second frame includes column and row parity information and the overhead portion and the data portion,
a synchronizer to specify locations of column and row parity information within the second frame, wherein a synchronization information represents the column and row parity information locations,
an encoder to insert column and row parity information into the second frame, and
a second mapper to convert the second frame into a third frame, wherein the third frame includes the overhead portion, the data portion, the column and row parity information, and the synchronization information; and
an interface to provide and receive signals from the data processor.

22. The system of claim 21, wherein the interface is compatible with XAUI.

23. The system of claim 21, wherein the interface is compatible with IEEE 1394.

24. The system of claim 21, wherein the interface is compatible with PCI.

25. The system of claim 21, further comprising a switch fabric coupled to the interface.

26. The system of claim 21, further comprising a packet processor coupled to the interface.

27. The system of claim 21, further comprising a bus to exchange signals with the data processor.

28. The system of claim 27, further comprising a memory device coupled to the bus.

29. The system of claim 21, wherein the data processor is to perform media access control in compliance with IEEE 802.3.

30. The system of claim 21, wherein the data processor is to perform optical transport network framing in compliance with ITU-T G.709.

31. The system of claim 21, wherein the data processor is to perform forward error correction encoding in compliance with ITU-T G.975.

32. A system comprising:
a data processor comprising:
a synchronizer to determine locations of column and row parity information within a first frame,
a first mapper to convert the first frame into a second frame, wherein the first frame includes an overhead portion, data portion, and a synchronization information and wherein the second frame comprises a programmable size and includes column and row parity information and further includes the overhead portion and the data portion,
a decoder to perform forward error correction on the second frame, and
a second mapper to convert the second frame into a third frame, wherein the third frame includes the overhead portion and the data portion; and an interface to provide and receive signals from the data processor.

33. The system of claim 32, wherein the interface is compatible with XAUI.

34. The system of claim 32, wherein the interface is compatible with IEEE 1394.

35. The system of claim 32, wherein the interface is compatible with PCI.

36. The system of claim 32, further comprising a switch fabric coupled to the interface.

37. The system of claim 32, further comprising a packet processor coupled to the interface.

38. The system of claim 32, further comprising a bus to exchange signals with the data processor.

39. The system of claim 38, further comprising a memory device coupled to the bus.

40. The system of claim 32, wherein the data processor is to perform media access control in compliance with IEEE 802.3.

41. The system of claim 32, wherein the data processor is to perform optical transport network de-framing in compliance with ITU-T G.709.

42. The system of claim 32, wherein the data processor is to perform forward error correction processing in compliance with ITU-T G.975.

* * * * *